United States Patent [19]
Streinz et al.

[11] Patent Number: 5,993,686
[45] Date of Patent: *Nov. 30, 1999

[54] FLUORIDE ADDITIVE CONTAINING CHEMICAL MECHANICAL POLISHING SLURRY AND METHOD FOR USE OF SAME

[75] Inventors: Christopher C. Streinz; Brian L. Mueller, both of Aurora; Michael A. Lucarelli, Mattoon; Max H. Walters, Naperville, all of Ill.

[73] Assignee: Cabot Corporation, Boston, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/659,419

[22] Filed: Jun. 6, 1996

[51] Int. Cl.⁶ .............................. C09K 13/00; C23F 3/00; H01L 21/306
[52] U.S. Cl. .......................... 252/79.3; 438/693; 438/754; 51/309
[58] Field of Search ..................... 438/693, 697, 438/754, 672; 252/79.3, 79.4; 51/308, 309; 106/3

[56] References Cited

U.S. PATENT DOCUMENTS

| | | | |
|---|---|---|---|
| 3,385,682 | 5/1968 | Lowen | 51/293 |
| 3,565,707 | 2/1971 | Radimer et al. | 156/3 |
| 3,843,430 | 10/1974 | Kinder | 156/20 |
| 3,887,403 | 6/1975 | Coggins | 156/7 |
| 4,345,969 | 8/1982 | James et al. | 156/659.1 |
| 4,671,851 | 6/1987 | Beyer et al. | 156/645 |
| 4,789,648 | 12/1988 | Chow et al. | 437/225 |
| 4,910,155 | 3/1990 | Cote et al. | 437/8 |
| 4,944,836 | 7/1990 | Beyer et al. | 156/645 |
| 4,954,459 | 9/1990 | Avanzion et al. | 437/228 |
| 4,956,313 | 9/1990 | Cote et al. | 437/203 |
| 4,992,135 | 2/1991 | Doan | 156/636 |
| 5,137,544 | 8/1992 | Medellin | 51/308 |
| 5,157,876 | 10/1992 | Medellin | 51/281 R |
| 5,173,438 | 12/1992 | Sandhu | 437/63 |
| 5,209,816 | 5/1993 | Yu et al. | 156/636 |
| 5,244,534 | 9/1993 | Yu et al. | 156/636 |
| 5,300,813 | 4/1994 | Joshi et al. | 257/752 |
| 5,314,843 | 5/1994 | Yu et al. | 437/225 |
| 5,340,370 | 8/1994 | Cadien et al. | 51/308 |
| 5,354,490 | 10/1994 | Yu et al. | 252/79.1 |
| 5,389,194 | 2/1995 | Rostoker et al. | 156/636 |
| 5,391,258 | 2/1995 | Brancaleoni et al. | 156/636 |
| 5,403,779 | 4/1995 | Joshi et al. | 437/190 |
| 5,407,526 | 4/1995 | Danielson et al. | 156/636.1 |
| 5,426,330 | 6/1995 | Joshi et al. | 257/752 |
| 5,439,551 | 8/1995 | Meikle et al. | 156/626 |
| 5,476,606 | 12/1995 | Brancaleoni et al. | 252/79.1 |
| 5,478,436 | 12/1995 | Winebeger et al. | 156/636.1 |
| 5,494,849 | 2/1996 | Iyer et al. | 437/63 |
| 5,516,346 | 5/1996 | Cadien et al. | 51/308 |
| 5,527,423 | 6/1996 | Neville et al. | 156/636.1 |
| 5,534,462 | 7/1996 | Fiordalice et al. | 437/190 |
| 5,614,444 | 3/1997 | Farkas et al. | 437/225 |
| 5,645,736 | 7/1997 | Allman | 216/89 |
| 5,647,952 | 7/1997 | Chen | 156/636.1 |
| 5,648,682 | 11/1995 | Homma | 437/195 |
| 5,700,383 | 12/1997 | Feller et al. | 216/88 |
| 5,756,398 | 5/1998 | Wang et al. | 438/692 |
| 5,770,103 | 6/1998 | Wang et al. | 252/79.1 |
| 5,783,489 | 7/1998 | Kaufman et al. | 438/692 |

*Primary Examiner*—Nam Nguyen
*Assistant Examiner*—Anita Alanko

[57] ABSTRACT

A chemical mechanical polishing slurry comprising an oxidizing agent, a fluoride containing additive and an abrasive and a method for using the fluoride containing additive chemical mechanical polishing slurry to remove tungsten and titanium from substrates.

33 Claims, No Drawings

FLUORIDE ADDITIVE CONTAINING CHEMICAL MECHANICAL POLISHING SLURRY AND METHOD FOR USE OF SAME

BACKGROUND OF THE INVENTION (1) Field of the Invention

The present invention relates to a chemical mechanical polishing slurry including a fluoride containing additive. This invention is also related to methods for using the chemical mechanical polishing slurry to polish multiple metal layers and thin-films in a single step during the manufacture of integrated circuits and semiconductors.

(2) Description of the Related Art

Integrated circuits are made up of millions of active devices formed in or on a silicon substrate. The active devices, which are initially isolated from one another, are united to form functional circuits and components. The devices are interconnected through the use of well-known multilevel interconnections.

Interconnection structures normally have a first layer of metallization, an interconnection layer, a second level of metallization, and sometimes a third and subsequent level of metallization. Interlevel dielectrics such as doped and undoped silicon dioxide ($SiO_2$), are used to electrically isolate the different levels of metallization in a silicon substrate or well. The electrical connections between different interconnection levels are made through the use of metallized vias. U.S. Pat. No. 4,789,648, which is incorporated herein by reference, describes a method for preparing multiple metallized layer and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to $SiO_2$. At the contact level, the adhesion layer acts as a diffusion barrier to prevent tungsten and $SiO_2$ from reacting.

In one semiconductor manufacturing process, metallized vias or contacts are formed by a blanket tungsten deposition followed by a chemical mechanical polish (CMP) step. In a typical process, via holes are etched through an interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess metal is removed by chemical mechanical polishing, (CMP) to form metal vias. Processes for manufacturing and/or CMP of ILD's are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects and corrosion and erosion. Furthermore, the polishing slurry may be used to provide controlled polishing selectivities to other thin-film materials used in current integrated circuit technology such as titanium, titanium nitride and the like.

Typically CMP polishing slurries contain an abrasive material, such as silica or alumina, suspended in an oxidizing, aqueous medium. For example, U.S. Pat. No. 5,244,523 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium. U.S. Pat. No. 5,340,370 to Cadien and Feller discloses a tungsten polishing slurry comprising approximately 0.1M potassium ferricyanide, approximately 5 weight percent silica and potassium acetate. Acetic acid is added to buffer the pH at approximately 3.5.

U.S. Pat. No. 5,340,370 discloses two slurries. The first slurry is useful for polishing tungsten and includes an abrasive and an oxidizing agent such as potassium ferricyanide. The second slurry is useful for polishing titanium and includes a fluoride salt complexing agent and an abrasive. The reference further discloses that detrimental polishing results are obtained when the slurries are combined.

It has been recognized that CMP slurries have low polishing rates towards titanium. As a result, the polishing step is lengthened or operated at aggressive polishing conditions that can cause undesirable erosion of the $SiO_2$ layer and recessing of the tungsten vias. Such recessing causes a non-planar via layer to be formed which impairs the ability to print high resolution lines during subsequent photolithography steps and can cause the formation of voids or open circuits in the metal interconnections formed above. Additionally, recessing increases when over polishing is used to ensure complete removal of the titanium and tungsten films across the surface of a wafer. Thus, presently available CMP slurries are inadequate to reliably polish a plurality of metal layers including a titanium layer in an integrated circuit. Accordingly, a new CMP polishing slurry that polishes titanium at a higher rate is needed to overcome the present substrate manufacturing reliability issues.

SUMMARY OF THE INVENTION

An object of this invention is a chemical mechanical polishing slurry that is able to polish titanium at high polishing rates, that retains a high tungsten and titanium nitride polishing rate, and that exhibits a low polishing rate towards $SiO_2$.

Yet another object of this invention is a single chemical mechanical polishing slurry that is able to polish a plurality of metal layers of an interlevel dielectric at high polishing rates while minimizing polishing defects, surface imperfections, and corrosion.

Another object of this invention is a method for using a chemical mechanical polishing slurry on interlevel dielectrics to expose vias associated with titanium adhesion layers.

In another embodiment, this invention is a chemical mechanical polishing slurry useful for polishing titanium and tungsten layered substrates. The chemical mechanical polishing slurry comprises an aqueous dispersion of an oxidizing agent, an abrasive, and a fluoride containing additive.

In still another embodiment, this invention is a method of using a chemical mechanical polishing slurry including a fluoride containing additive to polish titanium and tungsten metal layers associated with a multiple layer dielectric device.

Yet another embodiment of this invention is a method for using a chemical mechanical polishing slurry of this invention to polish a substrate comprising titanium by applying the chemical mechanical polishing slurry to the substrate, and removing at least a portion of the titanium adhesion layer by contacting the substrate with a pad and moving the pad in relation to the substrate.

DESCRIPTION OF THE CURRENT EMBODIMENT

The present invention relates to a chemical mechanical polishing slurry comprising an abrasive, an oxidizing agent, and a fluoride containing additive. This invention is also a method for using CMP slurries of this invention to abrade and/or polish multiple metal layers of metallization.

The chemical mechanical polishing slurry of this invention has been found to have a high titanium (Ti) polishing rate as well as a high tungsten (W) and titanium nitride (TiN) polishing rates. In addition, the chemical mechanical polishing slurry exhibits desirable low polishing rates towards the dielectric insulating layer.

Before describing the details of the various preferred embodiments of this invention, some of the terms that are used herein will be defined. The chemical mechanical polishing slurry ("CMP slurry") is a useful product of this invention that comprises an oxidizing agent, an abrasive, a fluoride containing additive as well as other optional ingredients. The CMP slurry is useful for polishing a multiple level metallization which may include but are not limited to semi-conductor thin-films, integrated circuit thin-films, and for any other films and surfaces where CMP processes are useful.

The oxidizing agent useful in the chemical mechanical polishing slurry is incorporated into a CMP slurry to aid in oxidizing a metal layer to its corresponding oxide or ions. For example, in the present invention, an oxidizing agent may be used to oxidize a metal layer to its corresponding oxide—titanium to titanium oxide, tungsten to tungsten oxide, and copper to copper oxide for example. The oxidizing agent of this invention is useful when incorporated into a polishing slurry to polish metals and metal based components including titanium, titanium nitride, tantalum, copper, tungsten, and various mixtures and combinations thereof by mechanically polishing the metals to remove the respective oxide layer.

A wide range of oxidizing agents may be used in the CMP slurry of this invention. Suitable oxidizing agents are those that are compatible with fluoride containing additives including oxidizing metal salts, oxidizing metal complexes, nonmetallic oxidizing acids such as peracetic and periodic acids, iron salts such as nitrates, sulfates, EDTA, citrates, potassium ferricyanide, hydrogen peroxide, potassium dichromate, potassium iodate, potassium bromate, vanadium trioxide and the like, aluminum salts, sodium salts, potassium salts, ammonium salts, quaternary ammonium salts, phosphonium salts, or other cationic salts of peroxides, chlorates, perchlorates, nitrates, permanganates, persulfates and mixtures thereof.

Typically, the oxidizing agent is present in the CMP slurry in an amount sufficient to ensure rapid oxidation of the metal layer while balancing the mechanical and chemical polishing components of the slurry. The oxidizing agent is typically present in the final CMP slurry in a concentration of from about 0.5% to 15% by weight, and preferably in a range between about 1% to about 7% by weight depending upon the particular oxidizing agent chosen.

The chemical mechanical polishing slurry of this invention includes an effective amount of a fluoride containing additive. The fluoride containing additive when incorporated into a polishing slurry improves the rate at which titanium is polished in comparison to prior art CMP slurries. It is believed that the fluoride component of the fluoride containing additive causes titanium to form a hydrated oxide layer that is more easily abraded than the oxide layer formed in the absence of fluoride.

The fluoride containing additive useful in the chemical mechanical polishing slurry may be any known fluoride containing additive or mixture of fluoride containing additives such as fluoride salts, fluoride containing acids, fluoride polymers, and any other organic or inorganic fluoride containing additives that react with titanium. Non-exclusive examples of useful fluoride containing acids include hydrofluoric acid (HF), fluorosilicic acid ($H_2SiF_6$), fluotitanic acid ($H_2TiF_6$), and fluoboric acid ($HBF_4$). Non-exclusive examples of useful fluoride salts include ammonium fluoride ($NH_4F$), ammonium hydrogen difluoride ($NH_4HF_2$), potassium fluoride (KF), potassium hydrogen difluoride ($KHF_2$), sodium fluoride (NaF), strontium fluoride ($SrF_2$), silver fluoride (AgF), tin fluoride ($SnF_2$), ammonium hexafluorosilicate (($NH_4)_2SiF_6$), potassium hexafluorosilicate ($K_2SiF_6$), potassium hexafluorotitanate ($K_2TiF_6$), ammonium hexafluorotitanate (($NH4)_2TiF_6$), ammonium tetrafluoroborate ($NH_4BF_4$), and potassium tetrafluoroborate ($KBF_4$).

It is preferred that the fluoride containing additive is selected from the group of fluoride acids consisting of hydrofluoric acid and fluorosilicic acid, from the group of fluoride salts consisting of potassium fluoride, ammonium fluoride, ammonium hydrogen difluoride, and potassium hydrogen difluoride, or mixtures thereof.

Sodium is recognized as a potential thin-layer film contaminant. Thus, the use of NaF in chemical mechanical polishing slurries is preferably avoided in applications where sodium contamination is undesirable.

Fluoride is a known titanium corrosive and if present in amounts greater than about 2.0 weight percent in the CMP slurry of this invention, the fluoride salt will corrode titanium and it will attack the $SiO_2$ layer and other metal layers that are susceptible to fluoride corrosion and erosion. Such undesirable fluoride attack can result in unacceptable pitting and/or corrosion of the substrate and vias. In order to avoid detrimental fluoride corrosion and erosion, the fluoride containing additive should be present in the chemical mechanical polishing slurry in an amount ranging from about 0.01 up to about 2.0 weight percent of the overall slurry. It has been discovered that this small amount of a fluoride containing additive in the CMP slurry is sufficient to have a dramatic effect on titanium polishing rates while avoiding undesirable fluoride corrosion and erosion.

A more preferred range of fluoride containing additive in the CMP slurry is from about 0.01 to about 1.0 wt %. When hydrofluoric acid is used, the final CMP slurry hydrofluoric acid content will preferably range from about 0.01 to about 0.30 wt %. When potassium fluoride, ammonium fluoride, ammonium hydrogen difluoride, or potassium hydrogen difluoride is used, the final CMP slurry fluoride containing additive content will preferably range from about 0.2 to about 1.0 weight percent.

The concentration ranges of fluoride containing additives in the CMP slurry of this invention are generally reported as a weight percent of the entire fluoride containing additive in the CMP slurry. The use of high molecular weight fluoride containing additives that comprise only a small percentage by weight of fluoride that ionizes in solution is well within the scope of fluoride containing additives of this invention. Thus, the term "fluoride containing additive" when used herein also encompasses fluoride containing additives that contain less than 25 percent by weight of fluoride wherein fluoride in the CMP slurry amounts to from about 0.01 to about 1.0 weight percent of the overall slurry.

The amount and type of fluoride containing additive used in the chemical mechanical polishing slurry will depend, in some instances, upon the oxidizing agent chosen as well as on the combinations of metals being polished. It is desirable to maintain the pH of the CMP slurry at between 1.0 to about 5.0 because tungsten corrosion problems can occur at a slurry pH above about 5.0. When the oxidizing agent used is ferric nitrate, it is preferred to maintain the pH of the chemical mechanical polishing slurry in a range from about 1.5 to about 3.0. Regardless of the oxidizing agent chosen, it is preferable to maintain the pH of the polishing slurry below about 5.0 in order to prevent etching and corrosion of tungsten. However, a CMP slurry pH in excess of 5.0 may be desirable when the CMP slurry is to be used to polish metals other than tungsten, such as copper.

The CMP slurry pH can drop below 1.0 when fluoride containing acids are incorporated into the slurry. A CMP slurry having a pH less than about 1.0 is still useful. However, at pH's less than about 1.5, handling the CMP slurry safely becomes a concern. Therefore, it is preferred that the CMP slurries of this invention have pH's greater that about 1.5. To achieve a minimum pH of 1.5 or greater, an aqueous base such as potassium hydroxide, sodium hydroxide, ammonium hydroxide or the like may be added to the chemical mechanical polishing slurry to raise the slurry pH to greater than about 1.5 and preferably within the desired range of from about 1.5 to about 5.0.

The CMP slurry of this invention also includes an abrasive. The abrasive is typically a metal oxide abrasive. The metal oxide abrasive may be selected from the group of alumina, titania, zirconia, germania, silica, ceria and mixtures thereof.

Preferably, the metal oxide is a fumed or precipitated abrasive and, more preferably it is a fumed abrasive such as fumed silica or fumed alumina. The metal oxide abrasive may be produced by techniques known to those skilled in the art. For example, the production of fumed metal oxides is a well-known process which involves the hydrolysis of suitable feedstock vapor (such as aluminum chloride for an alumina abrasive) in a flame of hydrogen and oxygen.

Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art. In addition, the abrasive may be produced using any high temperature process such as sol-gel or plasma processes.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

The chemical mechanical polishing slurry of this invention is most effective when the metal oxide particles are uniformly dispersed in a stable aqueous medium. The term "uniformly dispersed" means that the metal oxide abrasive particles or aggregates are isolated and well distributed throughout the aqueous medium. The term "stable" means that the metal oxide abrasive particles or aggregates will not agglomerate and/or settle out of the aqueous suspension to form, for example, a dense sediment.

A preferred metal oxide abrasive aqueous suspension will remain stable for at least three months. In this preferred embodiment, the metal oxide abrasive consists of metal oxide aggregates having a size distribution less than about 1.0 micron, a mean aggregate diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The aggregate size distribution in the present invention may be determined utilizing known techniques such as transmission electron microscopy (TEM). The mean aggregate diameter refers to the average equivalent spherical diameter when using TEM image analysis, i.e., based on the cross-sectional area of the aggregate. By force is meant that either the surface potential or the hydration force of the metal oxide particles must be sufficient to repel and overcome the van der Waals attractive forces between the particles.

Alternatively, the metal oxide abrasive may consist of discrete, individual metal oxide particles having a primary particle diameter less than 0.4 micron (400 nm) and a surface area ranging from about 10 $m^2/g$ to about 250 $m^2/g$.

The loading level of the abrasive in the final CMP slurry may comprise between 0.5% and 55% by weight of the overall slurry composition depending on the degree of abrasion required. The abrasion capability of the metal oxide, in turn, is a function of the particle composition, the degree of crystallinity and the crystalline phase, e.g., gamma or alpha. In order to achieve the desired selectivity and polishing rates, it has been found that the optimum surface area and loading level of the metal oxide abrasive may vary. For example, an alumina abrasive typically has a solids loading level in the final polishing slurry ranging between about 1% and about 12% by weight, preferably between 2% and 8% by weight, and more preferably between 1% and 6% by weight.

Other well known polishing slurry additives may be incorporated into the chemical mechanical polishing slurry of this invention. One type of optional additives are inorganic acids and/or salts thereof which may be added to the polishing slurry to further improve or enhance the polishing rate of the barrier layers in the wafer, such as titanium and tantalum. Useful inorganic additives include sulfuric acid, phosphoric acid, nitric acid, ammonium salts, potassium salts, sodium salts or other cationic salts of sulfates and phosphates.

A wide range of conventional organic acids, salts of organic acids, and mixtures thereof may be included in the CMP slurry of the present invention to enhance the selectivity to oxide polishing rate, such as monofunctional acids, difunctional acids, hydroxyl/carboxylate acids, chelating, non-chelating acids, and their salts. Preferably, the organic acid is selected from the group of acetic acid, adipic acid, butyric acid, capric acid, caproic acid, caprylic acid, citric acid, glutaric acid, glycolic acid, formic acid, fumaric acid, lactic acid, lauric acid, malic acid, maleic acid, malonic acid, myristic acid, oxalic acid, palmitic acid, phthalic acid, propionic acid, pyruvic acid, stearic acid, succinic acid, tartaric acid, valeric acid and derivatives, including salts thereof.

If used, an organic acid or salt should be present in the final CMP slurry, individually or in combination with other organic acids or salts, in an amount sufficient to enhance the oxide selectivity without detrimentally effecting the stability of the CMP slurry. As such, the organic acid is typically present in the slurry from about 0.05% to 15% by weight, and preferably in a range between 0.5% and 5.0% by weight. Examples of chemical mechanical polishing slurries including organic acids and salts thereof are disclosed in U.S. patent application Ser. No. 08/644,509 which is incorporated herein by reference.

In order to further stabilize a polishing slurry containing an oxidizing agent against settling, flocculation and decomposition of the oxidizing agent, a variety of additional optional additives, such as surfactants, polymeric stabilizers or other surface active dispersing agents, can be used. The surfactant can be anionic, cationic, nonionic, amphoteric and combinations of two or more surfactant can be employed. Furthermore, it has been found that the addition of a surfactant may be useful to improve the within-wafer-non-uniformity (WIWNU) of the wafers, thereby improving the surface of the wafer and reducing wafer defects.

In general, the amount of an additive used, such as a surfactant, in the present invention should be sufficient to achieve effective stearic stabilization of the slurry and will typically vary depending on the particular surfactant selected and the nature of the surface of the metal oxide abrasive. For example, if not enough of a selected surfactant is used, it will have little or no effect on stabilization. On the other hand, too much of the surfactant may result in undesirable foaming and/or flocculation in the slurry. As a result, additives like surfactants should generally be present in a range between about 0.001% and 10% by weight. Furthermore, the additive may be added directly to the slurry or treated onto the surface of the metal oxide abrasive utilizing known techniques. In either case, the amount of additive is adjusted to achieve the desired concentration in the polishing slurry.

One important application for the chemical mechanical polishing slurry of this invention is as a chemical mechanical polish for thin layer films comprising tungsten, and titanium. In such a polishing application, the single polishing slurry is effective to polish both titanium and tungsten layers and will preferably exhibit a tungsten to titanium polishing selectivity [W:Ti] of about 3:1-1:2.

The CMP slurry may be produced using conventional techniques known to those skilled in the art. Typically, the oxidizing agent, the fluoride containing additive, and any optional additives, are mixed into the aqueous medium, such as deionized or distilled water, at pre-determined concentrations under low shear conditions until such components are completely dissolved in the medium. A concentrated dispersion of the metal oxide abrasive, such as fumed alumina, is added to the medium and diluted to the desired loading level of abrasive in the final CMP slurry.

The CMP slurries of the present invention may be supplied as one package system (oxidizing agent, abrasive and fluoride containing additive in a stable aqueous medium). To avoid possible CMP slurry degradation, for example when ferric nitrate is an oxidizing agent and alumina is an abrasive, it is preferred that a two package system is used where the first package consists of an aqueous solution of the oxidizing agent and the fluoride containing additive and the second package consists of an aqueous dispersion of the abrasive.

Alternatively, a multi-package system may be used with any standard polishing equipment appropriate for use on the desired metal layer of the wafer. The multi-package system includes one or more CMP slurry components in aqueous or dry form in two or more containers. The multi-package system is used by combining the components from the various containers in the desired amounts to give a CMP slurry comprising an oxidizing agent, an abrasive, and a fluoride containing additive in amounts described above. When a multi-package system is used, the fluoride containing additive is preferably combined with the oxidizing agent before the oxidizing agent/fluoride containing additive mixture is added to the abrasive component. This order of addition prevents the fluoride containing additive from reacting with the abrasive component.

The polishing slurry of the present invention does not significantly increase the silicon dioxide polishing rate as would be expected of a composition containing a high concentration of fluoride ions. In addition, the polishing slurry may be effectively used to provide controlled polishing selectivities to other thin-film materials used as under-layers or barrier films in current integrated circuit technology, such as titanium, titanium nitride and the like.

The polishing slurry of the present invention may be used during the various stages of semiconductor integrated circuit manufacture to provide effective polishing at desired polishing rates while minimizing surface imperfections and defects.

EXAMPLES

We have discovered that the addition of small amounts of a fluoride containing additive to a chemical mechanical polishing slurry dramatically improves titanium layer polishing rates without decreasing tungsten and titanium nitride polishing rates, and without increasing silicon oxide polishing rates.

minute at the conditions set forth in Table I. The polishing results are also summarized in Table I.

As shown in Table I, control sample 1 had a tungsten polishing rate of 2350 Å/min and a titanium polishing rate of only 709 Å/min. The addition of a fluoride containing additive in an amount of 0.1 wt % of the slurry or more improved the titanium polishing rate by as much as 100% while the tungsten polishing rate varied little.

TABLE I

| Sample | Pressure (psi) | Slurry Rate (ml/min) | Table Speed (rpm) | Spindle Speed (rpm) | Down Force (psi) | % $H_2SiF_6$ | % HF | % $NH_4HF_2$ | W rate Å/min | Ti rate Å/min |
|---|---|---|---|---|---|---|---|---|---|---|
| 1 | 5 | 100 | 44 | 41 | 5 | 0 | 0 | 0 | 2350 | 709 |
| 2 | 5 | 100 | 44 | 41 | 5 | 0.1 | 0 | 0 | 2271 | 943 |
| 3 | 5 | 100 | 44 | 41 | 5 | 0.2 | 0 | 0 | 2052 | 1397 |
| 4 | 5 | 100 | 44 | 41 | 5 | 0 | 0.1 | 0 | 2355 | 1120 |
| 5 | 5 | 100 | 44 | 41 | 5 | 0 | 0.2 | 0 | 2340 | 1472 |
| 6 | 5 | 100 | 44 | 41 | 5 | 0 | 0 | 0.3 | 2289 | 1225 |
| 7 | 5 | 100 | 44 | 41 | 5 | 0 | 0 | 0.3** | 2103 | 1307 |

**pH of slurry adjusted to 1.6 with KOH.

The following examples illustrate preferred embodiments of this invention as well as preferred methods for using compositions of this invention.

Example I

A standard polishing slurry was prepared in order to evaluate the performance of a chemical mechanical polishing slurry comprising fluoride containing additives. Performance parameters measured included titanium polishing rates, tungsten polishing rates, silicon dioxide polishing rates, and so forth.

A standard polishing slurry including 3.0 wt % colloidal alumina, 5.0 wt % ferric nitrate and deionized water was used for each run. The polishing slurries were prepared by combining equal weight amounts of W-A355, a fumed alumina-based dispersion manufactured by the Microelectronics Materials Division of Cabot Corporation, in Tuscola, Ill. and sold under the trademark SEMI-SPERSE®, with FE-10, a ferric nitrate solution also manufactured by Cabot Corporation and sold under the trademark SEMI-SPERSE FE-10™. A known amount of a fluoride containing additive was combined with the FE-10 component before preparing the final slurry. The slurry was applied to wafers after preparation.

Example II

Seven polishing slurries were prepared according to the method of Example I to investigate the effect of fluoride containing components in the slurries on wafer selectivity and polishing efficiency. The slurries consisted of 3.0 wt % of fumed alumina, 5.0 wt % ferric nitrate and, except for control sample 1, a fluoride containing additive of the type and amount set forth in Table I. The slurry was used to chemically-mechanically polish tungsten and titanium blanket wafers having thicknesses of approximately 6,000 Å using a Suba 500-Suba IV pad stack manufactured by Rodel, Inc., Newark, Del. The polishing was performed for one

Example III

The purpose of this Example is to examine the effects of varying fluorosilicic acid ($H_2SiF_6$), ammonium fluoride ($NH_4F$), and hydrofluoric acid (HF) concentrations of chemical mechanical polishing slurries prepared according to Example I on tungsten and titanium polishing rates and selectivities.

Multiple runs using multiple slurries in each run were undertaken. The composition of each slurry used is summarized in Table 2. The slurries were prepared as described in Example I.

TABLE 2

| Run | Alumina Abrasive wt % | Ferric Nitrate wt % | $H_2SiF_6$ wt % | $NH_4F$ wt % | HF wt % |
|---|---|---|---|---|---|
| 1A | 3.0 | 5.0 | 0.1 | | 0 |
| 1B | 3.0 | 5.0 | 0.2 | | 0 |
| 1C | 3.0 | 5.0 | 0.3 | | 0 |
| 2D | 3.0 | 5.0 | 0.1 | 0.5 | 0 |
| 2E | 3.0 | 5.0 | 0.1 | 0.75 | 0 |
| 2F | 3.0 | 5.0 | 0.1 | 6.0 | 0 |
| 3G | 3.0 | 5.0 | 0.2 | 0.5 | 0 |
| 3H | 3.0 | 5.0 | 0.2 | 0.75 | 0 |
| 3I | 3.0 | 5.0 | 0.2 | 1.0 | 0 |
| 4J | 3.0 | 5.0 | 0.0 | | 0.2 |
| 4K | 3.0 | 5.0 | 0.0 | | 0.4 |
| 4L | 3.0 | 5.0 | 0.0 | | 0.6 |

The table polishing parameters used and the pad stack used in this Example are the same as described above in Example II.

A summary of the data obtained from the various runs is summarized in Table 3 below. The Ti polishing rate improves with increasing slurry fluoride content of the CMP slurry and in some instances the tungsten to titanium polishing selectivities ($S_{Ti}$) were improved to as much as 0.5.

TABLE 3

| Run | Slurry | % H$_2$SiF$_6$ | % NH$_4$F | % HF | W Rate Å/min | Ti Rate Å/min | S$_n$* | TEOS** Rate | S$_{TEOS}$ |
|---|---|---|---|---|---|---|---|---|---|
| 1 | A | 0.1 | 0 | 0 | 2271 | 943 | 2.4 | 35 | 65 |
|   | B | 0.2 | 0 | 0 | 2052 | 1397 | 1.5 | 73 | 33 |
|   | C | 0.3 | 0 | 0 | 1475 | 1880 | 0.8 | 82 | 18 |
| 2 | D | 0.1 | 0.5 | 0 | 1601 | 1860 | 0.9 | 73 | 26 |
|   | E | 0.1 | 0.75 | 0 | 1594 | 2809 | 0.6 | 82 | 19 |
|   | F | 0.1 | 1.0 | 0 | 1640 | 3636 | 0.5 | 96 | 17 |
| 3 | G | 0.2 | 0.5 | 0 | 1438 | 2136 | 0.7 | 66 | 22 |
|   | H | 0.2 | 0.75 | 0 | 1640 | 3115 | 0.5 | 72 | 23 |
|   | I | 0.2 | 1.0 | 0 | 1814 | 3825 | 0.5 | 89 | 21 |
| 4 | J | 0 | 0 | 0.2 | 2340 | 1472 | 1.6 | 71 | 33 |
|   | K | 0 | 0 | 0.4 | 1551 | 2768 | 0.6 | 114 | 14 |
|   | L | 0 | 0 | 0.6 | 2825 | 3800 | 0.7 | 181 | 18 |

*S$_{Ti}$ titanium polishing selectivity which is the tungsten polishing rate divided by the titanium polishing rate.
**S$_{TEOS}$ is the SiO$_2$ polishing selectivity which is the tungsten polishing rate divided by the TEOS polishing rate.

While the present invention has been described by means of specific embodiments, it will be understood that modifications may be made without departing from the spirit of the invention. The scope of the invention is not to be considered as limited by the description of the invention set forth in the specification and examples, but rather as defined by the following claims.

What we claim is:

1. An aqueous chemical mechanical polishing slurry comprising:
   (a) an oxidizing agent selected from the group consisting of oxidizing metal salts, oxidizing metal complexes, peracetic acids, periodic acids, iron salts, iron sulfites, iron nitrites, iron EDTA, iron citrates, potassium ferricyanide, hydrogen peroxide, potassium dichromate, potassium iodate, potassium bromate, vanadium trioxide, aluminum salts, sodium salts, potassium salts, ammonium salts, quaternary ammonium salts, phosphonium salts, cationic salts of peroxides, cationic, salts of chlorates, cationic salts of perchlorates, cationic salts of nitrates, cationic salts of permanganates, cationic salts of persulfates and mixtures thereof;
   (b) an abrasive; and
   (c) from about 0.01 to about 0.3 weight percent of a fluoride containing additive.

2. The chemical mechanical polishing slurry of claim 1 wherein the fluoride containing additives is selected from fluoride containing acids, fluoride salts, and mixtures thereof.

3. The chemical mechanical polishing slurry of claim 2 wherein the fluoride containing additive is a fluoride containing acid selected from the group consisting of hydrofluoric acid, fluorosilicic acid, fluoboric acid, fluotitanic acid, and mixtures thereof.

4. The chemical mechanical polishing slurry of claim 2 wherein the fluoride containing additive is a fluoride salt selected from the group consisting of ammonium fluoride, potassium fluoride, ammonium hydrogen difluoride, potassium hydrogen difluoride, and mixtures thereof.

5. The chemical mechanical polishing slurry of claim 1 wherein the oxidizing agent is selected from the group comprising iron salts, potassium salts, ammonium salts, quartenary ammonium salts, phosphonium salts, peroxides, chlorates, perchlorates, nitrates, permanganates, persulfates, and mixtures thereof.

6. The chemical mechanical polishing slurry of claim 5 wherein the oxidizing agent is ferric nitrate.

7. The chemical mechanical polishing slurry of claim 6 having a pH of from about 1.5 to about 3.0.

8. The chemical mechanical polishing slurry of claim 1 having a pH of from about 1.0 to about 5.0.

9. The chemical mechanical polishing slurry of claim 1 wherein the fluoride containing additive is hydrofluoric acid.

10. The chemical mechanical polishing slurry of claim 1 wherein the abrasive is a metal oxide.

11. The chemical mechanical polishing slurry of claim 10 wherein the metal oxide abrasive is selected from the group including alumina, ceria, germania, silica, titania, zirconia, and mixtures thereof.

12. The chemical mechanical polishing slurry of claim 1 wherein the abrasive is an aqueous dispersion of a metal oxide.

13. The chemical mechanical polishing slurry of claim 1 wherein the abrasive is alumina.

14. The chemical mechanical polishing slurry of claim 13 wherein the alumina is fumed alumina.

15. The chemical mechanical polishing slurry of claim 1 wherein the abrasive consists of fine metal oxide particles.

16. The chemical mechanical polishing slurry of claim 15 wherein the fine metal oxide particles comprise precipitated alumina or a fumed alumina.

17. The chemical mechanical polishing slurry of claim 1 further including a surfactant.

18. The chemical mechanical polishing slurry of claim 1 further including a compound selected from the group consisting of organic acids, salts of organic acids, and mixtures thereof.

19. The chemical mechanical polishing slurry of claim 1 further including a compound selected from the group consisting of inorganic acids, inorganic salts, and mixtures thereof.

20. An aqueous chemical mechanical polishing slurry useful for polishing substrates including titanium and tungsten comprising:
   from about 1 to about 7 weight percent ferric nitrate;
   from about 1 to about 12 weight percent alumina; and
   from about 0.01 to about 2.0 weight percent of a fluoride containing additive.

21. The chemical mechanical polishing slurry of claim 20 wherein the fluoride containing additive is selected from fluoride containing acids, fluoride salts, and mixtures thereof.

22. The chemical mechanical polishing slurry of claim 20 wherein the fluoride containing additive further comprises at least one fluoride containing acid and at least one fluoride salt wherein the chemical mechanical polishing slurry has a pH of from about 1.5 to about 3.0.

23. The chemical mechanical polishing slurry of claim 20 wherein the alumina is an aqueous dispersion of alumina.

24. The chemical mechanical polishing slurry of claim 20 wherein the alumina is fumed alumina.

25. The chemical mechanical polishing slurry of claim 20 having a tungsten to titanium polishing selectivity (W:Ti) of about 3:1-1:2.

26. A method for polishing a substrate including a titanium adhesion layer comprising:
   (a) admixing, an oxidizing agent selected from the group consisting of oxidizing metal salts, oxidizing metal complexes, peracetic acids, periodic acids, iron salts, iron sulfites, iron nitrites, iron EDTA, iron citrates, potassium ferricyanide, hydrogen peroxide, potassium dichromate, potassium iodate, potassium bromate, vanadium trioxide, aluminum salts, sodium salts, potassium salts, ammonium salts, quaternary ammonium salts, phosphonium salts, cationic salts of peroxides, cationic salts of chlorates, cationic salts of perchlorates, cationic salts of nitrates, cationic salts of permanganates, cationic salts of persulfates and mixtures thereof, from about 0.01 to about 0.3 weight percent of a fluoride containing additive and an abrasive to give a chemical mechanical polishing slurry having a pH of from about 1.0 to about 5.0;
   (b) applying the chemical mechanical polishing slurry to the substrate; and
   (c) removing a least a portion of the titanium adhesion layer by bringing a pad into contact with the substrate and moving the pad in relation to the substrate.

27. The method of claim 26 wherein the chemical mechanical polishing slurry is applied to the pad before the pad is placed into contact with the substrate.

28. The method of claim 26 wherein the oxidizing agent and the fluoride containing additive are held as an aqueous solution in a first container and an aqueous dispersion of abrasive is held in a second container and wherein a portion of the contents of the first container are combined with at least a portion of the contents of the second container to give an aqueous chemical mechanical polishing slurry comprising from about 1 to about 7 weight percent of the oxidizing agent, from about 1 to about 6 weight percent abrasive, and from about 0.01 to about 2.0 weight percent fluoride containing additive prior to applying the slurry to the pad.

29. The method of claim 28 wherein the fluoride containing additive is a fluoride containing acid selected from the group consisting of hydrofluoric acid, fluorosilicic acid and mixtures thereof.

30. The method of claim 29 wherein the fluoride containing additive is hydrofluoric acid.

31. The method of claim 28 wherein the fluoride containing additive is a fluoride salt selected from the group consisting of ammonium fluoride, potassium fluoride, ammonium hydrogen difluoride, and mixtures thereof.

32. The method of claim 31 wherein the fluoride salt is potassium fluoride in an amount ranging from about 0.2 to about 1.0 wt %.

33. A method for polishing a substrate including a titanium adhesion layer and a tungsten layer comprising:
   (a) admixing, ferric nitrate, alumina, and hydrofluoric acid with deionized water to give a mechanical chemical polishing slurry comprising from about 1 to about 7 weight percent ferric nitrate, from about 1 to about 6 weight percent alumina, and from about 0.1 to about 0.3 weight percent hydrofluoric acid wherein the chemical mechanical polishing slurry has a pH of from about 1.5 to about 2.5 and a tungsten to titanium polishing selectivity (W:Ti) of about 3:1-1:2.
   (b) applying the chemical mechanical polishing slurry to the substrate; and
   (c) removing a least a portion of the titanium adhesion layer and a portion of the tungsten layer by bringing a pad into contact with the substrate and moving the pad in relation to the substrate.

* * * * *